(12) United States Patent
Kain

(10) Patent No.: US 11,561,779 B1
(45) Date of Patent: *Jan. 24, 2023

(54) APPLICATIONS FOR HARDWARE ACCELERATORS IN COMPUTING SYSTEMS

(71) Applicant: XILINX, INC., San Jose, CA (US)

(72) Inventor: Julian M. Kain, Longmont, CO (US)

(73) Assignee: XILINX, INC., San Jose, CA (US)

( * ) Notice: Subject to any disclaimer, the term of this patent is extended or adjusted under 35 U.S.C. 154(b) by 332 days.

This patent is subject to a terminal disclaimer.

(21) Appl. No.: 16/996,717

(22) Filed: Aug. 18, 2020

Related U.S. Application Data

(63) Continuation of application No. 16/361,037, filed on Mar. 21, 2019, now Pat. No. 10,747,516.

(51) Int. Cl.
*G06F 8/41* (2018.01)
*G06F 9/50* (2006.01)

(52) U.S. Cl.
CPC ............ *G06F 8/445* (2013.01); *G06F 8/4434* (2013.01); *G06F 9/5033* (2013.01)

(58) Field of Classification Search
None
See application file for complete search history.

(56) References Cited

U.S. PATENT DOCUMENTS

| | | | |
|---|---|---|---|
| 7,831,938 B2 | 11/2010 | Bowyer et al. | |
| 9,652,570 B1 | 5/2017 | Kathail et al. | |
| 9,864,828 B1 | 1/2018 | Puthana et al. | |
| 2008/0320247 A1 | 12/2008 | Morfey et al. | |
| 2016/0283209 A1 | 9/2016 | Bertolli et al. | |
| 2017/0315755 A1 | 11/2017 | Smith | |
| 2018/0189215 A1 | 7/2018 | Boesch et al. | |
| 2019/0340491 A1 | 11/2019 | Norden et al. | |

*Primary Examiner* — Philip Wang
(74) *Attorney, Agent, or Firm* — Patterson + Sheridan, LLP

(57) ABSTRACT

An example method of implementing an application for a hardware accelerator having a programmable device coupled to memory is disclosed. The method includes compiling source code of the application to generate logical circuit descriptions of kernel circuits; determining resource availability in a dynamic region of programmable logic of the programmable device, the dynamic region exclusive of a static region of the programmable logic programmed with a host interface configured to interface a computing system having the hardware accelerator; determining resource utilization by the kernel circuits in the dynamic region; determining fitting solutions of the kernel circuits within the dynamic region, each of the fitting solutions defining connectivity of the kernel circuits to banks of the memory; adding a memory subsystem to the application based on a selected fitting solution of the fitting solutions; and generating a kernel image configured to program the dynamic region to implement the kernel circuits and the memory subsystem.

20 Claims, 16 Drawing Sheets

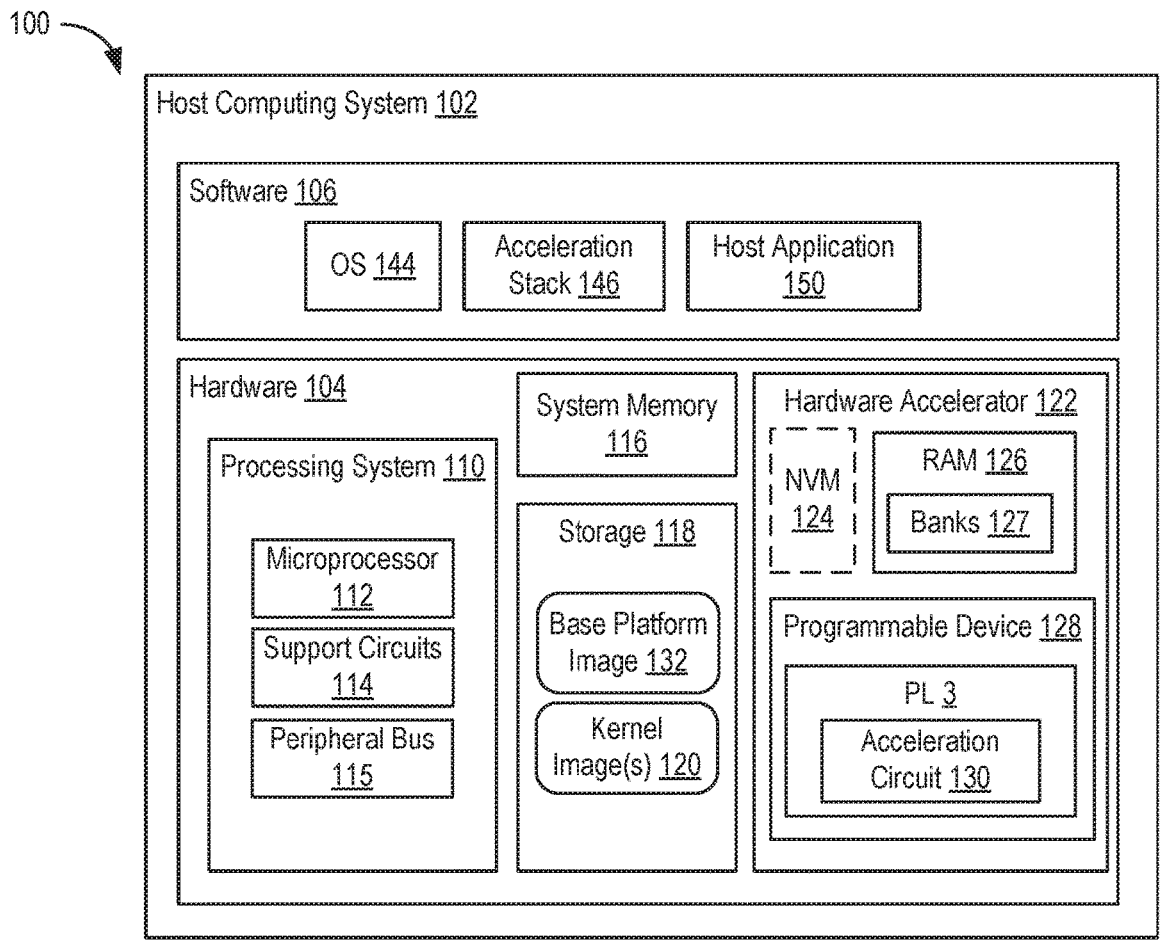
FIG. 1A
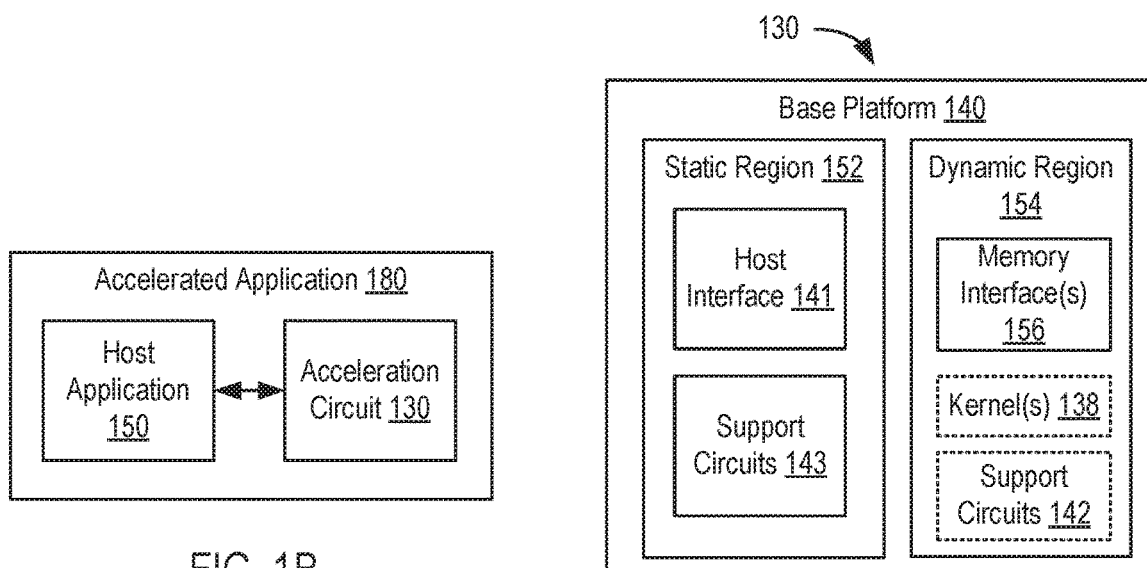
FIG. 1B
FIG. 1C

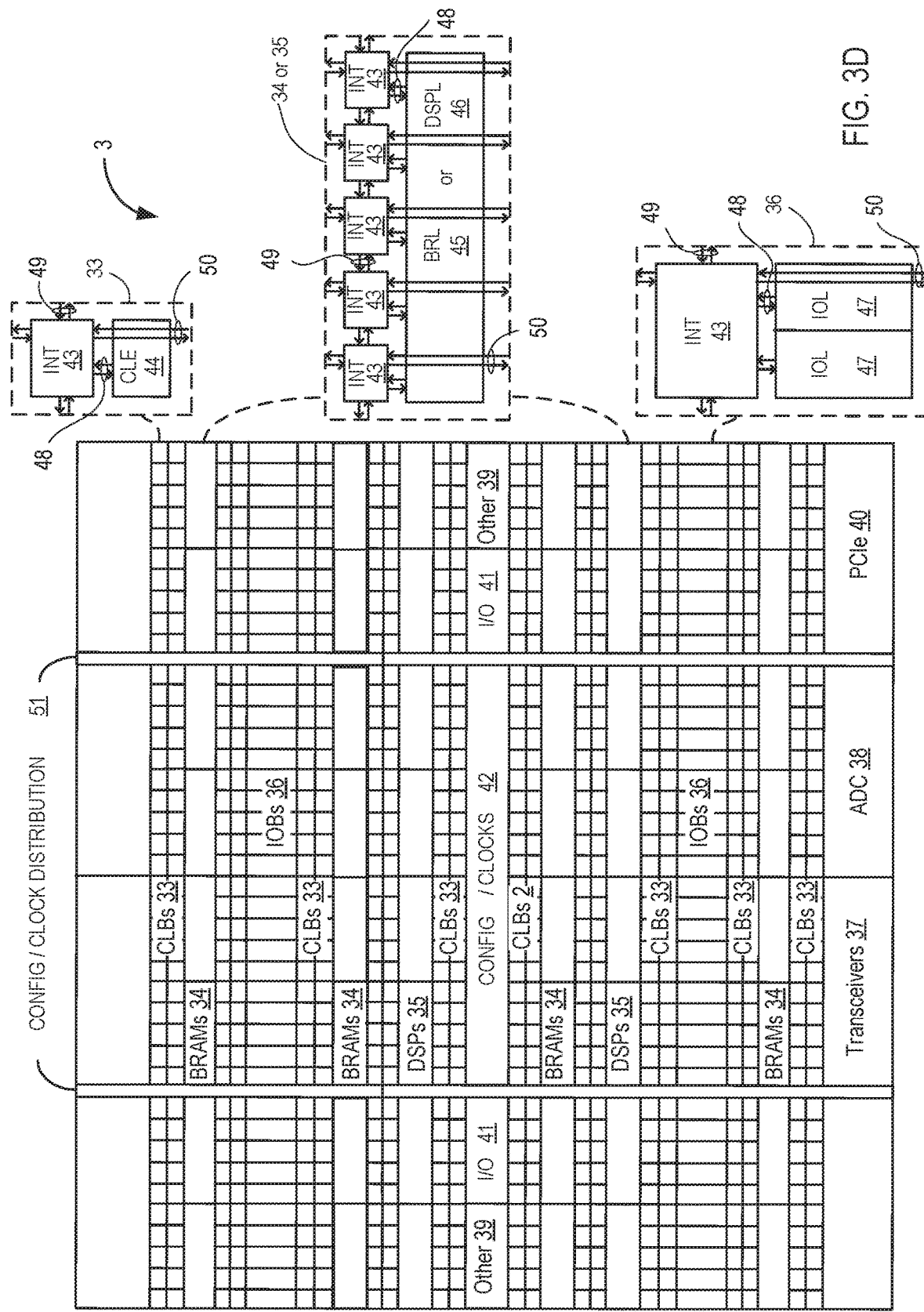

APPLICATIONS FOR HARDWARE ACCELERATORS IN COMPUTING SYSTEMS

TECHNICAL FIELD

Examples of the present disclosure generally relate to hardware acceleration in computing systems and, in particular, to implementing applications for hardware accelerators in computing systems.

BACKGROUND

Hardware acceleration involves the use of hardware to perform some functions more efficiently than software executing on a general-purpose CPU. A hardware accelerator is special-purpose hardware designed to implement hardware acceleration for some application. Example applications include neural networks, video encoding, decoding, transcoding, etc., network data processing, and the like. Software executing on the computing system interacts with the hardware accelerator through various drivers and libraries. One type of hardware accelerator includes a programmable device and associated circuitry. For example, the programmable device can be a field programmable gate array (FPGA) or a system-on-chip (SOC) that includes FPGA programmable logic among other components, such as a processing system, data processing engine (DPE) array, network-on-chip (NOC), and the like.

Users employ development environments to design applications for hardware accelerators. Users interact with a development environment to define an application using software programming languages and/or register transfer level (RTL) descriptions of circuits. Users then interact with the development environment to compile the application source code and generate implementation file(s) used to configure a target platform (e.g., a hardware accelerator in a computer system). The compilation process includes several steps, some of which involve placing compute units (referred to herein as "kernels") designed by the user in programmable logic of a programmable device, and connecting memory interfaces of the kernels to particular channels (referred to herein as "banks") of memory on the hardware accelerator. Inefficient placement of kernels in the programmable logic can lead to routing congestion, inefficient use of the memory, and ultimately poor quality of results (QOR).

SUMMARY

Techniques for implementing applications for hardware accelerators in computing systems are described. In an example, a method of implementing an application for a hardware accelerator having a programmable device coupled to memory is disclosed. The method includes compiling source code of the application to generate logical circuit descriptions of kernel circuits; determining resource availability in a dynamic region of programmable logic of the programmable device, the dynamic region exclusive of a static region of the programmable logic programmed with a host interface configured to interface a computing system having the hardware accelerator; determining resource utilization by the kernel circuits in the dynamic region; determining fitting solutions of the kernel circuits within the dynamic region, each of the fitting solutions defining connectivity of the kernel circuits to banks of the memory; adding a memory subsystem to the application based on a selected fitting solution of the fitting solutions; and generating a kernel image configured to program the dynamic region to implement the kernel circuits and the memory subsystem.

In another example, a non-transitory computer readable medium having instructions stored thereon that cause a processor to perform a method of implementing an application for a hardware accelerator having a programmable device coupled to memory. The method includes compiling source code of the application to generate logical circuit descriptions of kernel circuits; determining resource availability in a dynamic region of programmable logic of the programmable device, the dynamic region exclusive of a static region of the programmable logic programmed with a host interface configured to interface a computing system having the hardware accelerator; determining resource utilization by the kernel circuits in the dynamic region; determining fitting solutions of the kernel circuits within the dynamic region, each of the fitting solutions defining connectivity of the kernel circuits to banks of the memory; adding a memory subsystem to the application based on a selected fitting solutions of the fitting solutions; and generating a kernel image configured to program the dynamic region to implement the kernel circuits and the memory subsystem.

In another example, a computing system includes a memory configured to store development software; and a processor, coupled to the memory, configured to execute the development software to implement an application for a hardware accelerator having a programmable device coupled to memory by: compiling source code of the application to generate logical circuit descriptions of kernel circuits; determining resource availability in a dynamic region of programmable logic of the programmable device, the dynamic region exclusive of a static region of the programmable logic programmed with a host interface configured to interface a host computing system having the hardware accelerator; determining resource utilization by the kernel circuits in the dynamic region; determining fitting solutions of the kernel circuits within the dynamic region, each of the fitting solutions defining connectivity of the kernel circuits to banks of the memory; adding a memory subsystem to the application based on a selected fitting solution of the fitting solutions; and generating a kernel image configured to program the dynamic region to implement the kernel circuits and the memory subsystem.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 1A is a block diagram depicting a hardware acceleration system according to an example.

FIG. 1B is a block diagram depicting an accelerated application according to an example.

FIG. 1C is a block diagram depicting an acceleration circuit according to an example.

FIG. 3D illustrates a field programmable gate array (FPGA) implementation of a programmable IC according to an example.

To facilitate understanding, identical reference numerals have been used, where possible, to designate identical elements that are common to the figures. It is contemplated that elements of one example may be beneficially incorporated in other examples.

DETAILED DESCRIPTION

Figure 2:
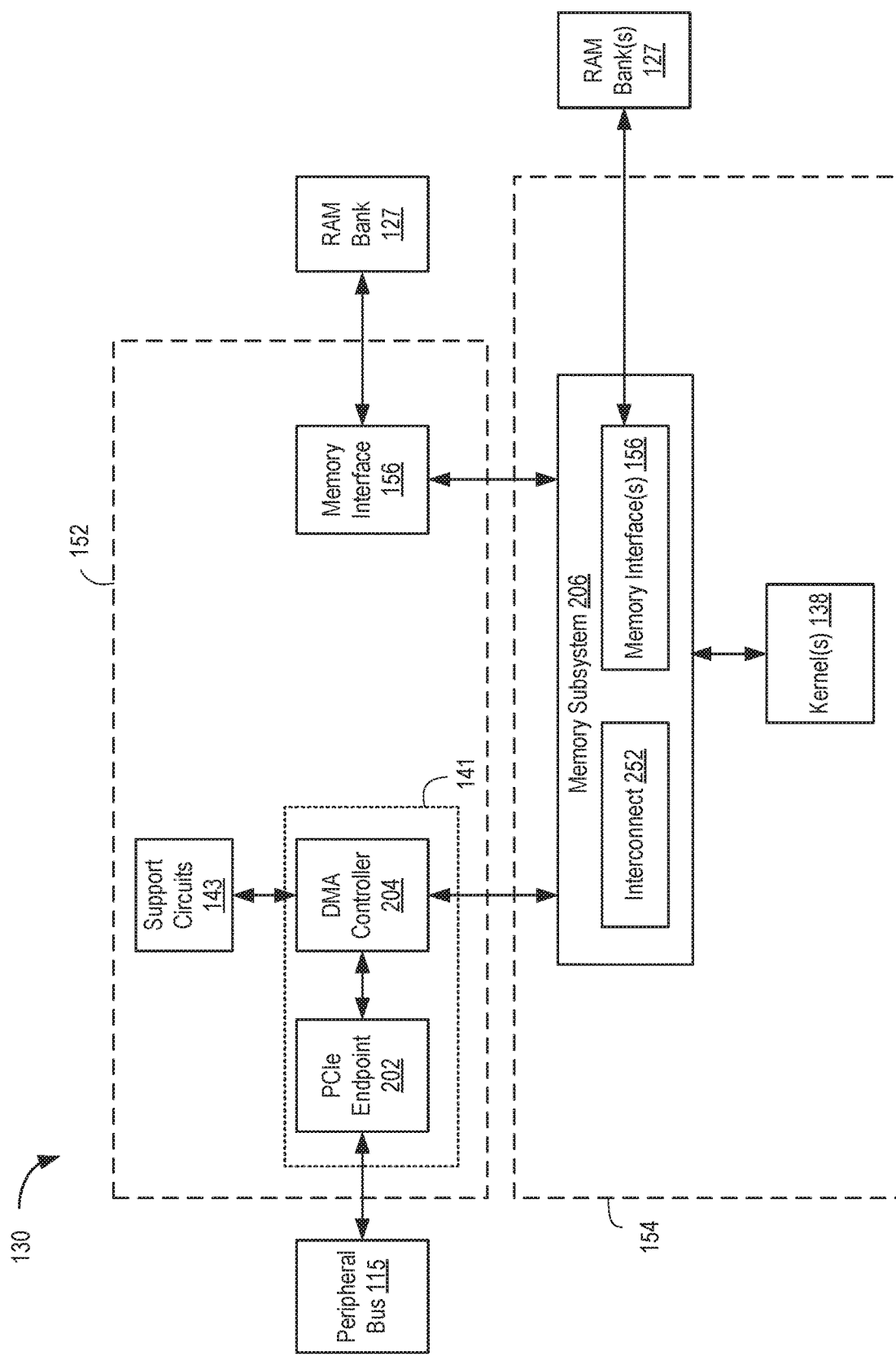
FIG. 2 is a block diagram depicting the acceleration circuit in more detail according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for implementing applications for hardware accelerators in computing systems are described. The techniques are described wherein the context of an accelerated application having a host application executing on a host computer and an acceleration circuit programmed in programmable logic of a programmable device. The acceleration circuit includes a base platform having a static region and a dynamic region in the programmable logic. The static region includes a host interface for access by the host application. The host application programs the dynamic region with user-defined kernels and a tool-generated memory subsystem. During development of the kernels, a compiler compiles kernel source code to generate logical circuit descriptions thereof. A linker processes the logical circuit descriptions to link the kernels with the base platform and connect the kernels with memory interfaces in the programmable logic. The memory interfaces are physically connected to different channels or "banks" of memory. The techniques described herein provide for an optimal linking process that searches through valid kernel fitting solutions and memory connectivity solutions to identify optimal kernel fitting and memory connectivity solutions. Armed with the knowledge of proposed kernel locations in the dynamic region, the linker can add the memory subsystem to implement the optimal memory connectivity solution. These and other aspects are described below with respect to the drawings.

FIG. 1A is a block diagram depicting a hardware acceleration system 100 according to an example. The hardware acceleration system 100 includes a host computing system 102. The host computing system 102 includes a hardware platform ("hardware 104") and a software platform ("software 106") executing on the hardware 104. The hardware 104 includes a processing system 110, system memory 116, storage devices ("storage 118"), and a hardware accelerator 122. The software 106 includes an operating system (OS) 144, an acceleration stack 146, and a host application 150.

The processing system 110 includes a microprocessor 112, support circuits 114, and a peripheral bus 115. The microprocessor 112 can be any type of general-purpose central processing unit (CPU), such as an x86-based processor, ARM®-based processor, or the like. The microprocessor 112 can include one or more cores and associated circuitry (e.g., cache memories, memory management units (MMUs), interrupt controllers, etc.). The microprocessor 112 is configured to execute program code that perform one or more operations described herein and which can be stored in the system memory 116 and/or the storage 118. The support circuits 114 include various devices that cooperate with the microprocessor 112 to manage data flow between the microprocessor 112, the system memory 116, the storage 118, the hardware accelerator 122, or any other peripheral device. For example, the support circuits 114 can include a chipset (e.g., a north bridge, south bridge, platform host controller, etc.), voltage regulators, firmware (e.g., a basic input-output system (BIOS)), and the like. The support circuits 114 manage data flow between the microprocessor 112 and the peripheral bus 115, to which various peripherals, such as the hardware accelerator 122, are connected. In some examples, the microprocessor 112 can be a System-in-Package (SiP), System-on-Chip (SOC), or the like, which absorbs all or a substantial portion of the functionality of the chipset (e.g., north bridge, south bridge, etc.). The peripheral bus 115 can implement an expansion bus standard, such as Peripheral Component Interconnect Express (PCIe) or the like.

The system memory 116 is a device allowing information, such as executable instructions and data, to be stored and retrieved. The system memory 116 can include, for example, one or more random access memory (RAM) modules, such as double-data rate (DDR) dynamic RAM (DRAM). The storage 118 includes local storage devices (e.g., one or more hard disks, flash memory modules, solid state disks, and optical disks) and/or a storage interface that enables the computing system 102 to communicate with one or more network data storage systems. The hardware 104 can include various other conventional devices and peripherals of a computing system, such as graphics cards, universal serial bus (USB) interfaces, and the like.

The hardware accelerator 122 includes a programmable device 128 and RAM 126. The hardware accelerator 122 can optionally include a non-volatile memory (NVM) 124. The programmable device 128 can be a field programmable gate array (FPGA) or an SOC having FPGA programmable logic along with other embedded subsystems. The NVM 124 can include any type of non-volatile memory, such as flash memory or the like. The RAM 126 can include DDR DRAM or the like. The RAM 126 can be organized into discrete RAM banks 127, as described further below. The programmable device 128 is coupled to the NVM 124 and the RAM 126. The programmable device 128 is also coupled to the peripheral bus 115 of the processing system 110.

The OS 144 can be any commodity operating system known in the art, such as such as Linux®, Microsoft Windows®, Mac OS®, or the like. The acceleration stack 146 includes drivers and libraries that provide application programming interfaces (APIs) to the hardware accelerator 122 for command and control thereof.

FIG. 1B is a block diagram depicting an accelerated application 180 according to an example. The accelerated application 180 includes the host application 150 and an acceleration circuit 130. The acceleration circuit 130 is programmed in programmable logic (PL) 3 of the programmable device 128 on the hardware accelerator 122. The host application 150 includes software executing on the microprocessor 112 that invokes the acceleration circuit 130 using API calls to the acceleration stack 146 to perform some work. The host application 150 can include neural network, video processing, network processing, or the like type applications that offload some functions to the hardware accelerator 122.

FIG. 1C is a block diagram depicting the acceleration circuit 130 according to an example. The acceleration circuit 130 includes a base platform 140 having two regions in the PL 3: a static region 152 and a dynamic region 154. The base platform 140 includes a host interface circuit ("host interface 141") and optionally other support circuits 143 programmed in the static region 152. The base platform 140 provides one or more memory interfaces 156 in the dynamic region 154 and/or static region 152 (the memory interfaces 156 are shown only in the dynamic region 154 in the example). Each memory interface 156 is physically coupled to a respective RAM bank 127 of the RAM 126. The base platform 140 is programmed in the programmable device 128 upon startup of host computing system 102 from a base platform image 132. The base platform image 132 can be stored in the storage 118 or the NVM 124. The base platform 140 is exclusive of kernel(s) 138 and support circuits 142, which are programmed separately using a kernel image 120.

In particular, the host application 150 calls APIs of the acceleration stack 146 to program kernel circuits ("kernel(s) 138") and associated support circuits 142 in the dynamic region 154 of the base platform 140 using a kernel image 120. The kernel(s) 138 include compute units for processing data, and the support circuits 142 include interconnects to circuitry in the static region 152 (e.g., the host interface 141), as well as interconnects to the memory interface(s) 156 accessing the RAM 126. One or more kernel images 120 can be stored in the storage 118 for implementing different sets of kernel(s) 138. Each kernel image 120 includes data for programming only the dynamic region 154.

Once the kernel(s) 138 have been programmed in the dynamic region 154, the host application 150 can access the kernel(s) 138 through the host interface 141. The host application 150 can also access the RAM 126 through the host interface 141. In operation, the host application 150 stores data to be processed by the kernel(s) 138 in the RAM 126. The host application 150 then provides instructions to the kernel(s) 138 to being processing the data in the RAM 126. The kernel(s) 138 read the data from the RAM 126 and store result data back to the RAM 126. The kernel(s) 138 notify the host application 150 of the result data through the host interface 141. The host application 150 then reads the result data from the RAM 126 through the host interface 141.

In the example, the processing system 110 is shown separate from the hardware accelerator 122. In other examples discussed further below, the processing system 110 and the hardware accelerator 122 can be implemented within the same programmable device (e.g., a programmable device with an embedded processing system). In such case, the processing system 110 can utilize alternative interconnects with the PL 3 for communicating with the acceleration circuit 130, examples of which are described below.

FIG. 2 is a block diagram depicting the acceleration circuit 130 in more detail according to an example. In the example, the host interface 141 of the base platform 140 includes a PCIe endpoint circuit ("PCIe endpoint 202") and a DMA controller 204. The base platform 140 can also include various support circuits 143 in the static region 152. In an example, the static region 152 also includes a memory interface 156. The PCIe endpoint 202 provides a physical interface to the peripheral bus 115. The DMA controller 204 facilitates DMA operations to the RAM 126 and the kernel(s) 138. The support circuits 143 can include any other circuit, such as decoupler circuits (to support partial reconfiguration), flash programmer, debug circuits, and the like. The memory interface 156 is part of the PL 3 and is configured to provide an interface to a channel of the RAM 126, e.g., a RAM bank 127 of the RAM 126. In other examples, the static region 152 may not include a memory interface 156.

The dynamic region 154 includes the kernels 138 and the memory interface(s) 156. Each of the memory interfaces 156 is part of the PL 3 and is configured to provide an interface to a channel of the RAM 126, e.g., a RAM bank 127 of the RAM 126. The acceleration circuit 130 includes a memory subsystem 206. The memory subsystem 206 includes interconnect circuits ("interconnect 252") and the memory interfaces 156 in the dynamic region 154. The memory subsystem 206 couples the DMA controller 204 and the kernel(s) 138 to the memory interfaces 156 of the programmable device 128. The interconnect 252 provides memory-mapped connections between the DMA controller 204 and memory interfaces 156, and between the DMA controller 204 and the kernels 138. The interconnect 252 provides memory-mapped connections between the kernel(s) 138 and the memory interfaces 156.

Figure 3A:
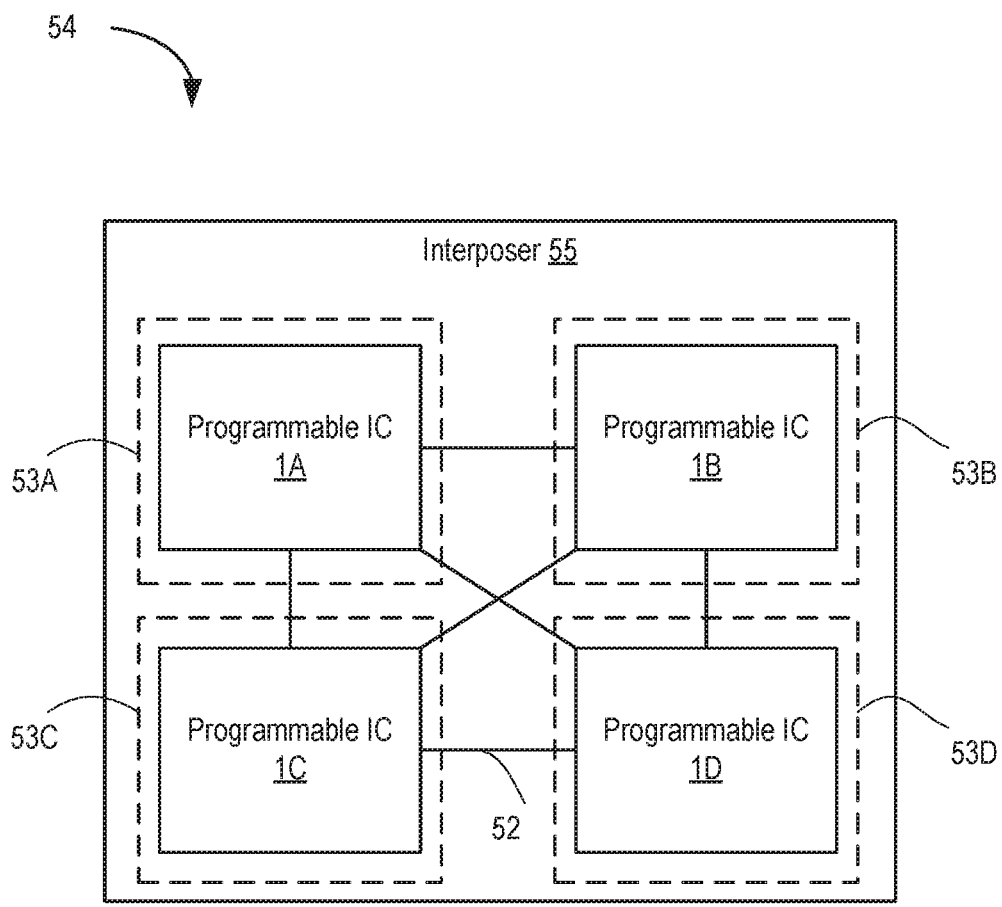
FIG. 3A is a block diagram depicting a multi-integrated circuit (IC) programmable device according to an example.

FIG. 3A is a block diagram depicting a programmable device 54 according to an example. The programmable device 54 can be used to implement the programmable device 128 in the hardware accelerator 122. The programmable device 54 includes a plurality of programmable integrated circuits (ICs) 1, e.g., programmable ICs 1A, 1B, 1C, and 1D. In an example, each programmable IC 1 is an IC die disposed on an interposer 55. Each programmable IC 1 comprises a super logic region (SLR) 53 of the programmable device 54, e.g., SLRs 53A, 53B, 53C, and 53D. The programmable ICs 1 are interconnected through conductors on the interposer 55 (referred to as super long lines (SLLs) 52).

Figure 3B:
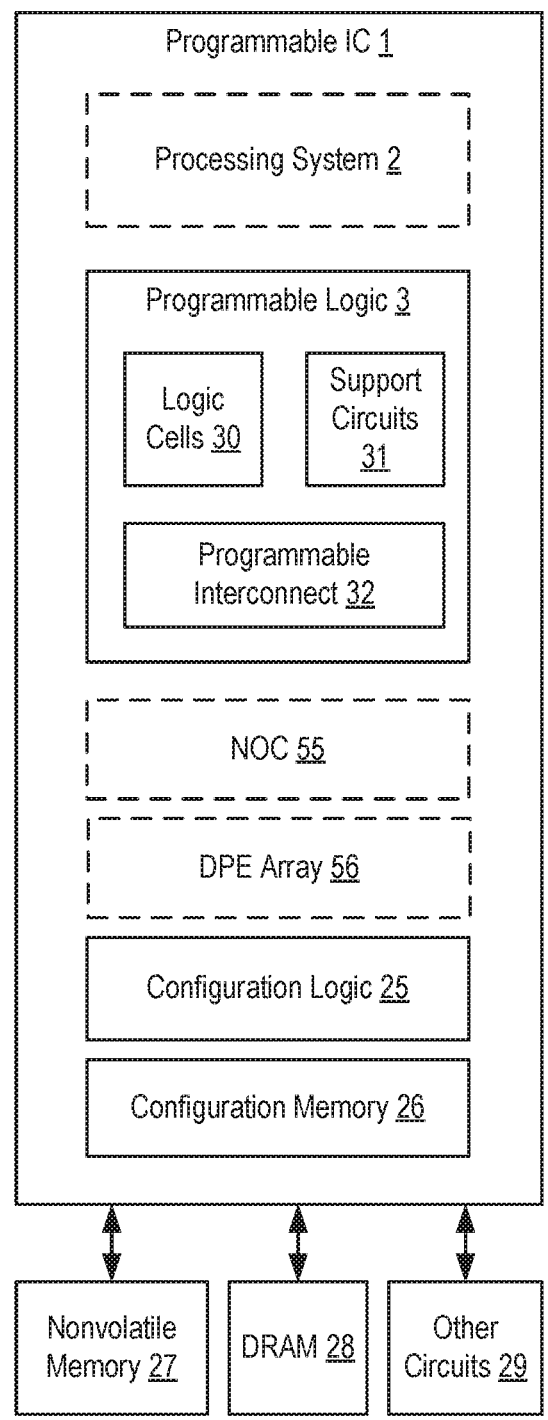
FIG. 3B is a block diagram depicting a programmable IC according to an example.

FIG. 3B is a block diagram depicting a programmable IC 1 according to an example. The programmable IC 1 can be used to implement the programmable device 128 or one of the programmable ICs 1A-1D in the programmable device 54. The programmable IC 1 includes programmable logic 3 (also referred to as a programmable fabric), configuration logic 25, and configuration memory 26. The programmable IC 1 can be coupled to external circuits, such as nonvolatile memory 27, DRAM 28, and other circuits 29. The programmable logic 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuits 29). In some examples, the programmable IC 1 includes a processing system 2. The processing system 2 can include microprocessor(s), memory, support circuits, IO circuits, and the like. In some examples, the programmable IC 1 includes a network-on-chip (NOC) 55 and data processing engine (DPE) array 56. The NOC 55 is configured to provide for communication between subsystems of the programmable IC 1, such as between the PS 2, the PL 3, and the DPE array 56. The DPE array 56 can include an array of DPE's configured to perform data processing, such as an array of vector processors.

Figure 3C:
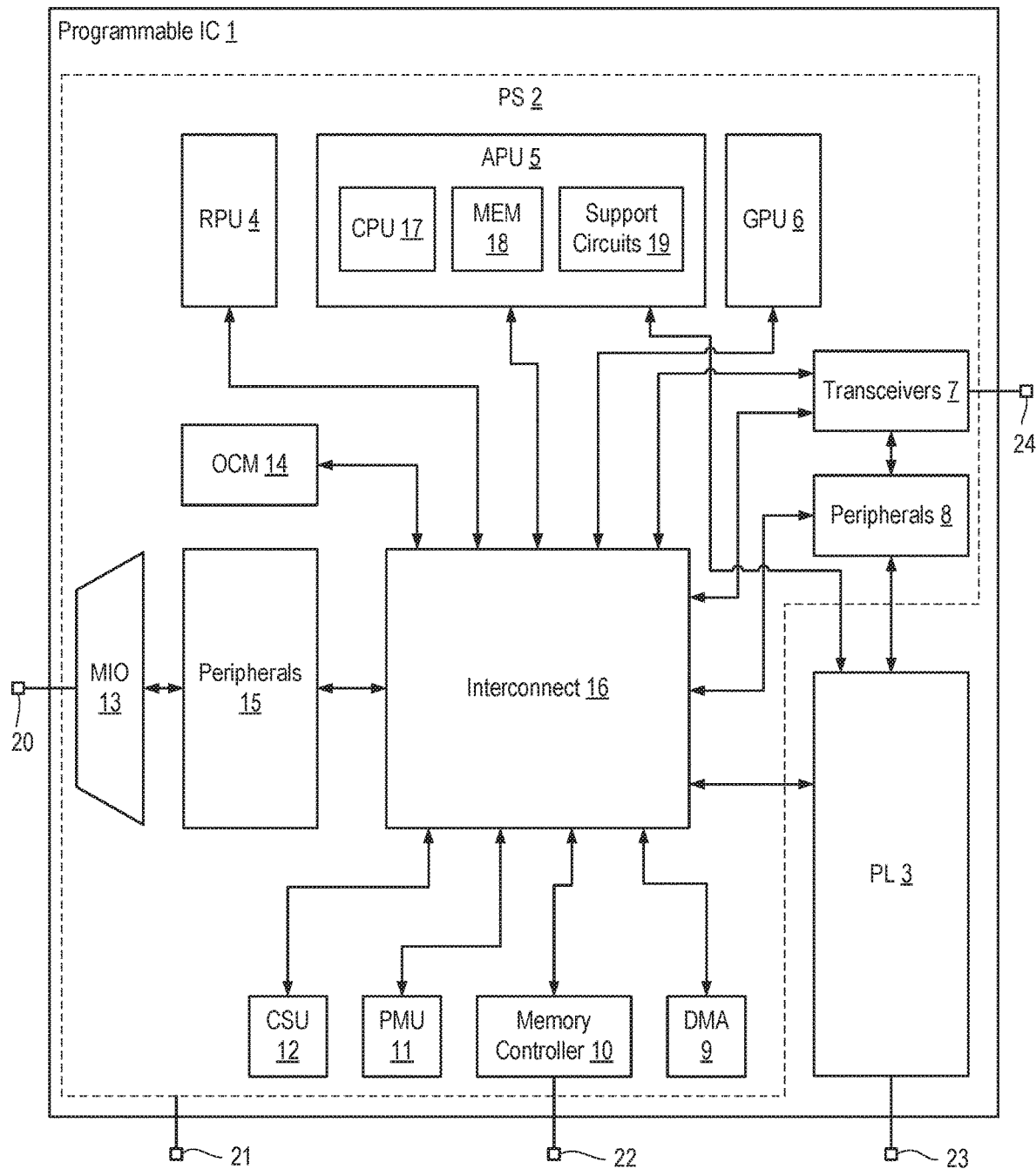
FIG. 3C is a block diagram depicting a System-on-Chip (SOC) implementation of a programmable IC according to an example.

FIG. 3C is a block diagram depicting an SOC implementation of the programmable IC 1 according to an example. In the example, the programmable IC 1 includes the processing system 2 and the programmable logic 3. The processing system 2 includes various processing units, such as a real-time processing unit (RPU) 4, an application processing unit (APU) 5, a graphics processing unit (GPU) 6, a configuration and security unit (CSU) 12, a platform management unit (PMU) 11, and the like. The processing system 2 also includes various support circuits, such as on-chip memory (OCM) 14, transceivers 7, peripherals 8, interconnect 16, DMA circuit 9, memory controller 10, peripherals 15, and multiplexed IO (MIO) circuit 13. The processing units and the support circuits are interconnected by the interconnect 16. The PL 3 is also coupled to the interconnect 16. The transceivers 7 are coupled to external pins 24. The PL 3 is coupled to external pins 23. The memory controller 10 is coupled to external pins 22. The MIO 13 is coupled to external pins 20. The PS 2 is generally coupled to external pins 21. The APU 5 can include a CPU 17, memory 18, and support circuits 19.

In the example of FIG. 3C, the programmable IC 1 can be used in the hardware accelerator 122 and can function as described above. The acceleration circuit 130 can be programmed in the PL 3 and function as described above. In another example, the functionality of the hardware 104 described above can be implemented using the PS 2, rather than through hardware of a computing system. In such case, the software 106 executes on the PS 2 and functions as described above.

Referring to the PS 2, each of the processing units includes one or more central processing units (CPUs) and associated circuits, such as memories, interrupt controllers, direct memory access (DMA) controllers, memory management units (MMUs), floating point units (FPUs), and the like. The interconnect 16 includes various switches, busses, communication links, and the like configured to interconnect the processing units, as well as interconnect the other components in the PS 2 to the processing units.

The OCM 14 includes one or more RAM modules, which can be distributed throughout the PS 2. For example, the OCM 14 can include battery backed RAM (BBRAM), tightly coupled memory (TCM), and the like. The memory controller 10 can include a DRAM interface for accessing external DRAM. The peripherals 8, 15 can include one or more components that provide an interface to the PS 2. For example, the peripherals 15 can include a graphics processing unit (GPU), a display interface (e.g., DisplayPort, high-definition multimedia interface (HDMI) port, etc.), universal serial bus (USB) ports, Ethernet ports, universal asynchronous transceiver (UART) ports, serial peripheral interface (SPI) ports, general purpose IO (GPIO) ports, serial advanced technology attachment (SATA) ports, PCIe ports, and the like. The peripherals 15 can be coupled to the MIO 13. The peripherals 8 can be coupled to the transceivers 7. The transceivers 7 can include serializer/deserializer (SERDES) circuits, MGTs, and the like.

FIG. 3D illustrates a field programmable gate array (FPGA) implementation of the programmable IC 1 that includes the PL 3. The PL 3 shown in FIG. 3D can be used in any example of the programmable devices described herein. The PL 3 includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The PL 3 can also include PCIe interfaces 40, analog-to-digital converters (ADC) 38, and the like.

In some PLs, each programmable tile can include at least one programmable interconnect element ("INT") 43 having connections to input and output terminals 48 of a programmable logic element within the same tile, as shown by examples included at the top of FIG. 3D. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated PL.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An IOB 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 3D) is used for configuration, clock, and other control logic. Vertical columns 51 extending from this horizontal area or column are used to distribute the clocks and configuration signals across the breadth of the PL.

Some PLs utilizing the architecture illustrated in FIG. 3D include additional logic blocks that disrupt the regular columnar structure making up a large part of the PL. The additional logic blocks can be programmable blocks and/or dedicated logic. Note that FIG. 3D is intended to illustrate only an exemplary PL architecture. For example, the numbers of logic blocks in a row, the relative width of the rows, the number and order of rows, the types of logic blocks included in the rows, the relative sizes of the logic blocks, and the interconnect/logic implementations included at the top of FIG. 3D are purely exemplary. For example, in an actual PL more than one adjacent row of CLBs is typically included wherever the CLBs appear, to facilitate the efficient implementation of user logic, but the number of adjacent CLB rows varies with the overall size of the PL.

Figure 4:
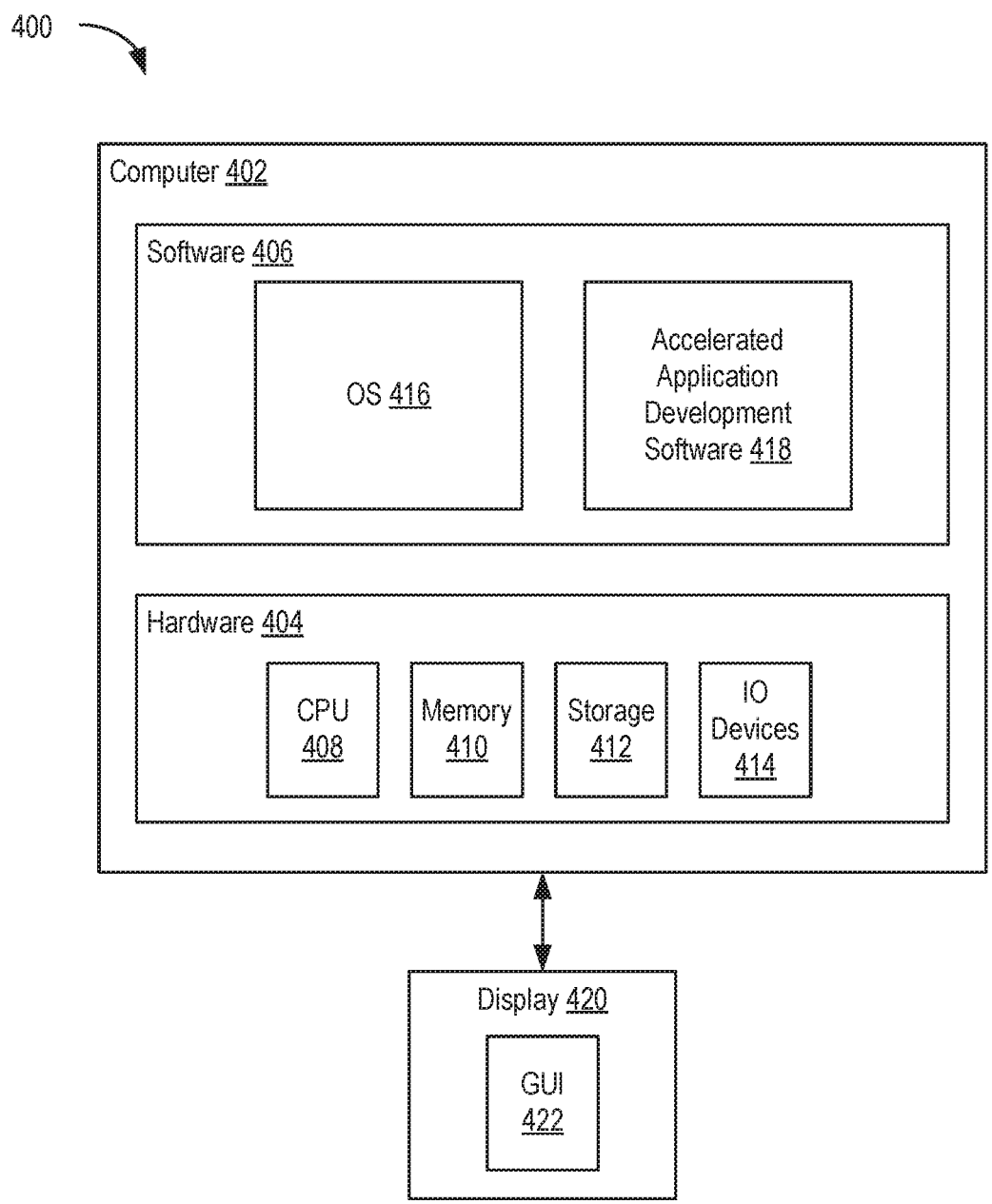
FIG. 4 is a block diagram depicting accelerated application design system according to an example.

FIG. 4 is a block diagram depicting accelerated application design system 400 according to an example. The accelerated application design system 400 includes a computer 402 having a hardware platform 404 and a software platform 406. The hardware platform 404 includes a CPU 408, a memory 410, storage devices 412, and input/output (IO) devices 414. The CPU 408 can be any type of microprocessor. The memory 410 can include, for example, one or more RAM modules, such as DDR DRAM. The storage devices 412 includes local storage devices (e.g., one or more hard disks, flash memory modules, solid state disks, and optical disks) and/or a storage interface that enables the computer 402 to communicate with one or more network data storage systems. The IO devices 414 enable communication to and from the computer 402. The software platform 406 includes an OS 416 and accelerated application development software 418. The OS 416 can be any commodity operating system known in the art, such as such as Linux®, Microsoft Windows®, Mac OS®, or the like. The accelerated application development software 418 is configured to generate executable software and images for programming programmable logic to implement hardware acceleration circuitry.

The computer 402 can be coupled to a display 420 that presents a graphical user interface (GUI) 422 to the user to interact with the software/hardware development software 418. The GUI 422 can include a graphic interface through which a user connects symbols and blocks representing various circuit components to produce a schematic of a circuit, which is converted into RTL source. The GUI 422 can also include a text interface through which a user writes program language code (C, C++, etc.) and/or RTL code.

Figure 5A:
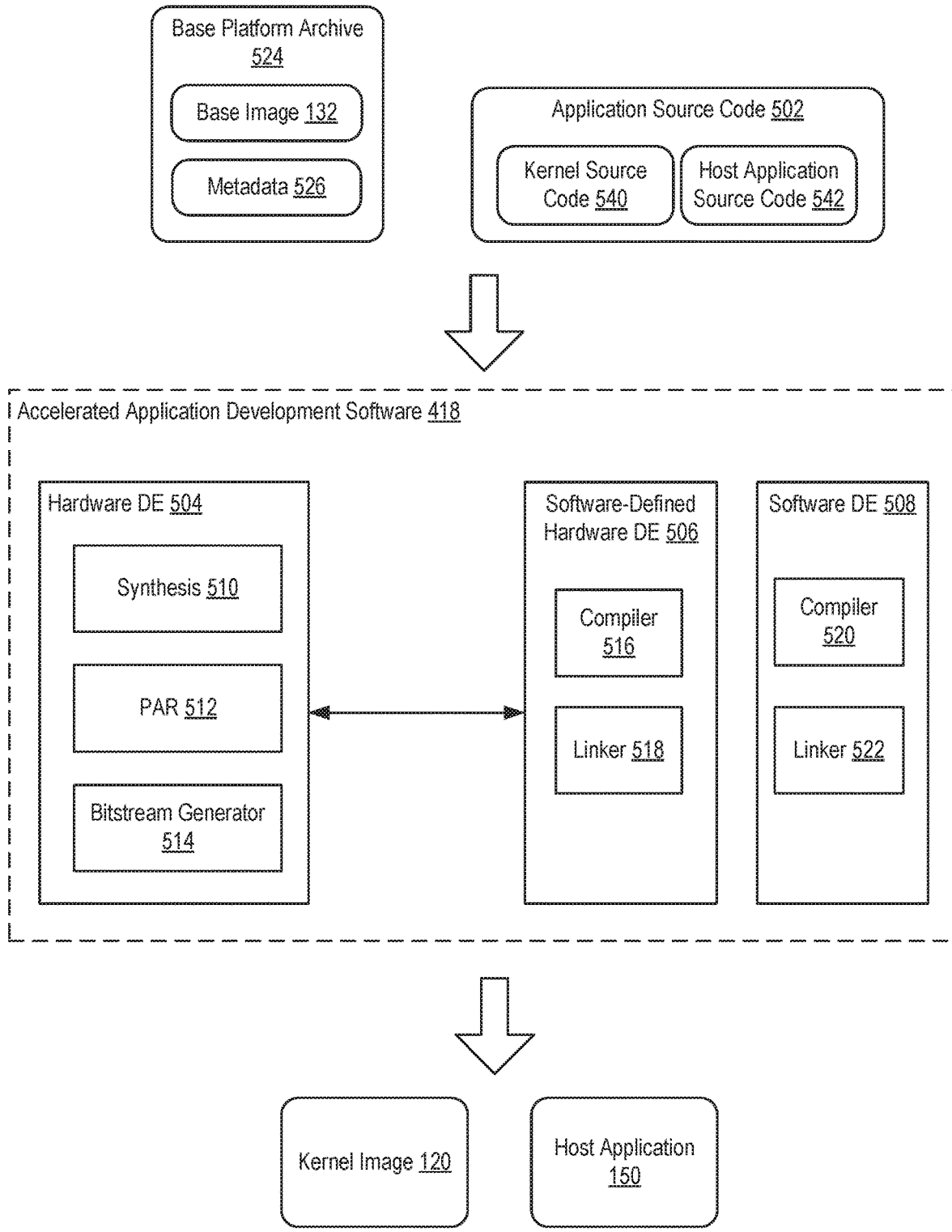
FIG. 5A is a block diagram depicting accelerated application development software according to an example.

FIG. 5A is a block diagram depicting the accelerated application development software 418 according to an example. The accelerated application development software 418 includes a hardware development environment (DE) 504, a software-defined hardware DE 506, and a software DE 508. A user interacts with the accelerated application development software 418 to create application source code 502. The application source code 502 includes kernel source code 540 that defines the functionality of the kernel(s) 138, and host application source code 542 that defines the functionality of the host application 150. The kernel source code 540 can include program language descriptions and/or hardware language descriptions (referred to herein as register-transfer level (RTL) descriptions) of the kernel(s) 138. The host application source code 542 includes program language descriptions of the host application 150.

The software DE 508 includes a compiler 520 and a linker 522 configured to compile source code defined using a programming language (e.g., C, C++, and the like) and link with shared libraries, including those of the acceleration stack 146. The software DE 508 processes the host application source code 542 and generates the host application 150.

The hardware DE 504 is configured to transform an abstract description of a circuit through various intermediate transformations to produce a physical description of the circuit. The hardware DE 504 can format the physical description of the circuit into a binary image that can program a target programmable device to realize the circuit therein. The hardware DE 504 includes a synthesis tool 510, a place-and-route (PAR) tool 512, and a bitstream generator 514, among other tools not specifically shown.

The synthesis tool 510 generates a logical circuit description from an input functional description. The functional description can be specified in RTL source and/or using a programming language (C, C++, OpenCL C, etc.). The logical circuit description includes a logical representation of a circuit in terms of specific logic elements. For example, the synthesis tool 510 can perform "technology mapping" that transforms generic circuit elements into technology-specific circuit elements. For example, the logical circuit description can include a representation of a circuit in terms of specific logic elements optimized to the architecture of a programmable device, such as lookup tables (LUTs), carry logic, IO buffers, memories, digital signal processors (DSPs), and like technology-specific components. In another example, the logical circuit description can include a representation of a circuit in terms of gates, flip-flops, and the like (sometimes referred to as a "gate-level description"). The logical circuit description can be specified in a netlist.

The PAR tool 512 generates a physical circuit description from the logical circuit description. The PAR tool 512 places instances of circuit components specified in the logical circuit description within a physical layout of the target programmable device ("placement"). The PAR tool 512 also routes nets between the instances specified in the logical circuit description using wires in the target programmable device. The bitstream generator 514 formats the physical circuit description into a binary image that can program the target programmable device to realize the circuit.

The software-defined hardware DE 506 includes a compiler 516 and a linker 518. The compiler 516 processes the kernel source code 540. The kernel source code 540 defines a functional description of the kernels 138 using a programming language (C, C++, OpenCL C, etc.). The compiler 516 generates an RTL circuit description from the programming language description. The compiler 516 can also generate a synthesized netlist from the RTL circuit description. The compiler 516 can also invoke tools in the hardware DE 504 (e.g., the synthesis tool 510) during the compilation process.

The linker 518 processes the output of the compiler 516 to link the kernels 138 with the base platform 140. The user can specify a particular base platform 140 to be used by identifying a base platform archive 524. The base platform archive 524 includes the base platform image 132 and associated metadata 526. The linker 518 places the kernels 138 in the dynamic region 154 and adds a memory subsystem to the dynamic region 154 for connecting memory ports of the kernels 138 to particular RAM banks 127. The linker 518 generates the kernel image 120 as output. The linker can invoke tools in the hardware DE 504 (e.g., the PAR tool 512 and the bitstream generator 514) during the linking process.

Figure 5B:
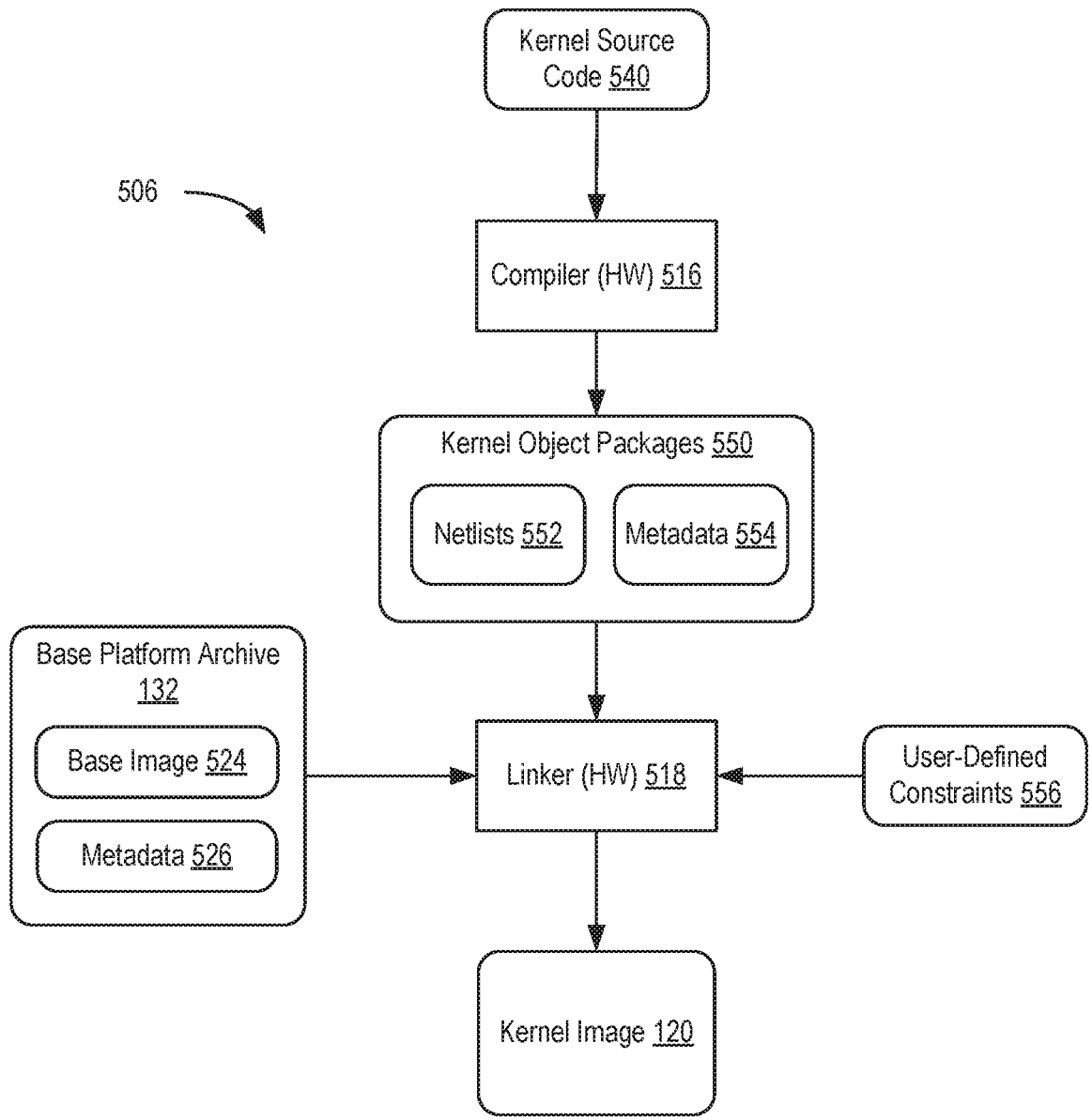
FIG. 5B is a block diagram depicting a software-defined hardware development environment according to an example

FIG. 5B is a block diagram depicting the software-defined hardware DE 506 according to an example. The compiler 516 processes the kernel source code 540 to generate kernel object packages 550. The kernel object packages 550 include netlists 552 and metadata 554. The netlists 552 include logical circuit descriptions (e.g., synthesized RTL). The metadata 554 can include various data related to the netlists 552, such as the programmable logic resources used by the netlists 552. The linker 518 processes the kernel object packages 550. The linker 518 also obtains the base platform archive 132 to access the metadata 526, which can include the programmable logic resources available in the dynamic region 154 (i.e., the programmable logic resources not used by the base platform 140). The linker 518 can also receive user-defined constraints 556, which can include constraints on one or more of the kernels, such as kernel placement constraints and/or kernel memory connectivity constraints. The linker 518 adds the memory subsystem 206 to connect the kernels to the available memory interfaces. The linker 518 outputs the kernel image 120.

One technique for linking the kernels to the base platform is to use a standard packing algorithm. That is, the linker can connect up to a maximum number of supported kernels to the first available memory interface, followed by the next number of supported kernels to the next memory interface, etc., until either all kernels are linked or all memory resources are utilized. This serialized packing approach, while logically correct, produces oversized and inefficient interconnect infrastructure in the memory subsystem, namely interconnects in N×1 configurations, where N is large and the resulting crossbar logic is very resource-intensive. The complex connectivity to each memory interface also tends to cause the PAR tool to struggle with placing kernels appropriately while avoiding timing-challenged SLR crossings and general routing congestion. The net effect is that the software-oriented developer often ends up getting poor QOR, very long runtimes, and sometimes failed builds, without obvious cause. The only recourse for developers is to add hardware-oriented switches or constraints, which hurts developer productivity and reduces the intended abstraction level.

In techniques described herein, the linker 518 employs a front-end, solver-based approach to achieving better default logical connectivity of kernels to the memory subsystem interconnect, thereby facilitating easier placement, better QOR, and faster runtimes downstream—the net effect being that the abstracted software developer does not need to know about the hardware or the specific structure of the device they are targeting. By automatically taking into account the available physical resources of the platform's dynamic region with per-SLR granularity, together with the sizes of the kernels to be linked, and the memory bandwidth heuristics, the solver finds good default connectivity by identifying legal placements of kernels so they can fit within SLRs, as well as balanced memory interface mappings for those kernels so they do not over-utilize memory bandwidth. The user is still free to specify constraints and switches if they wish to override the defaults, but the linker 518 provides good defaults so such hardware-oriented intervention is not usually required. By operating automatically at the beginning of the design flow, the better logical design benefits the back-end flow considerably.

Figure 6A:
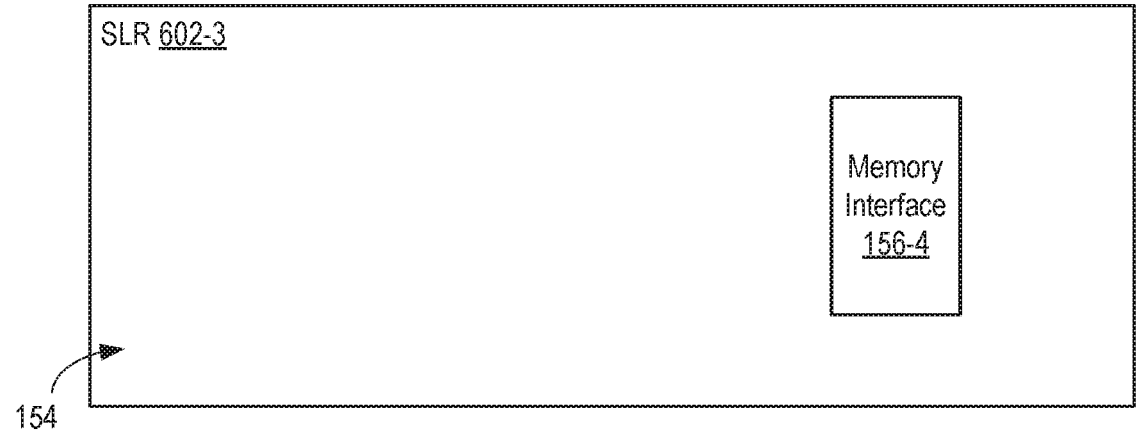
FIG. 6A is a block diagram depicting an example layout of a base platform according to an example.
Figure 6A:
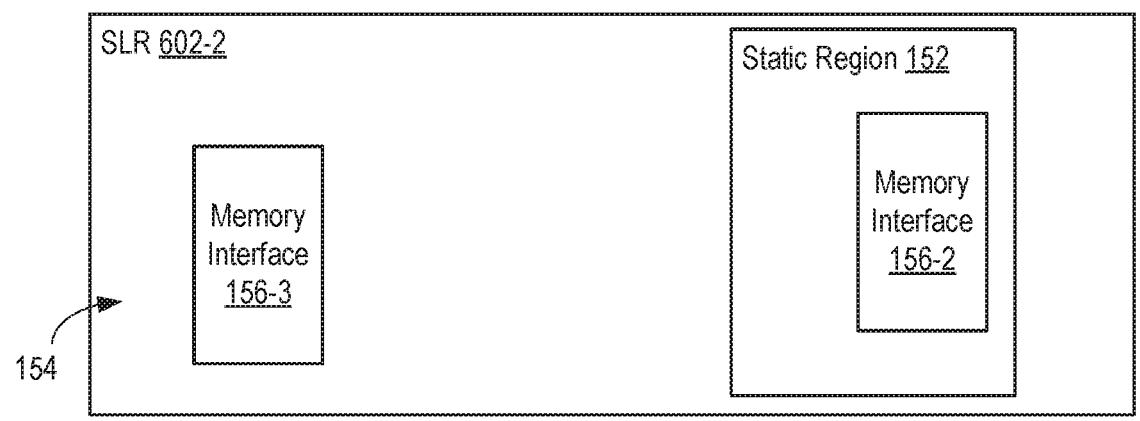
Figure 6A:
Figure 6B:
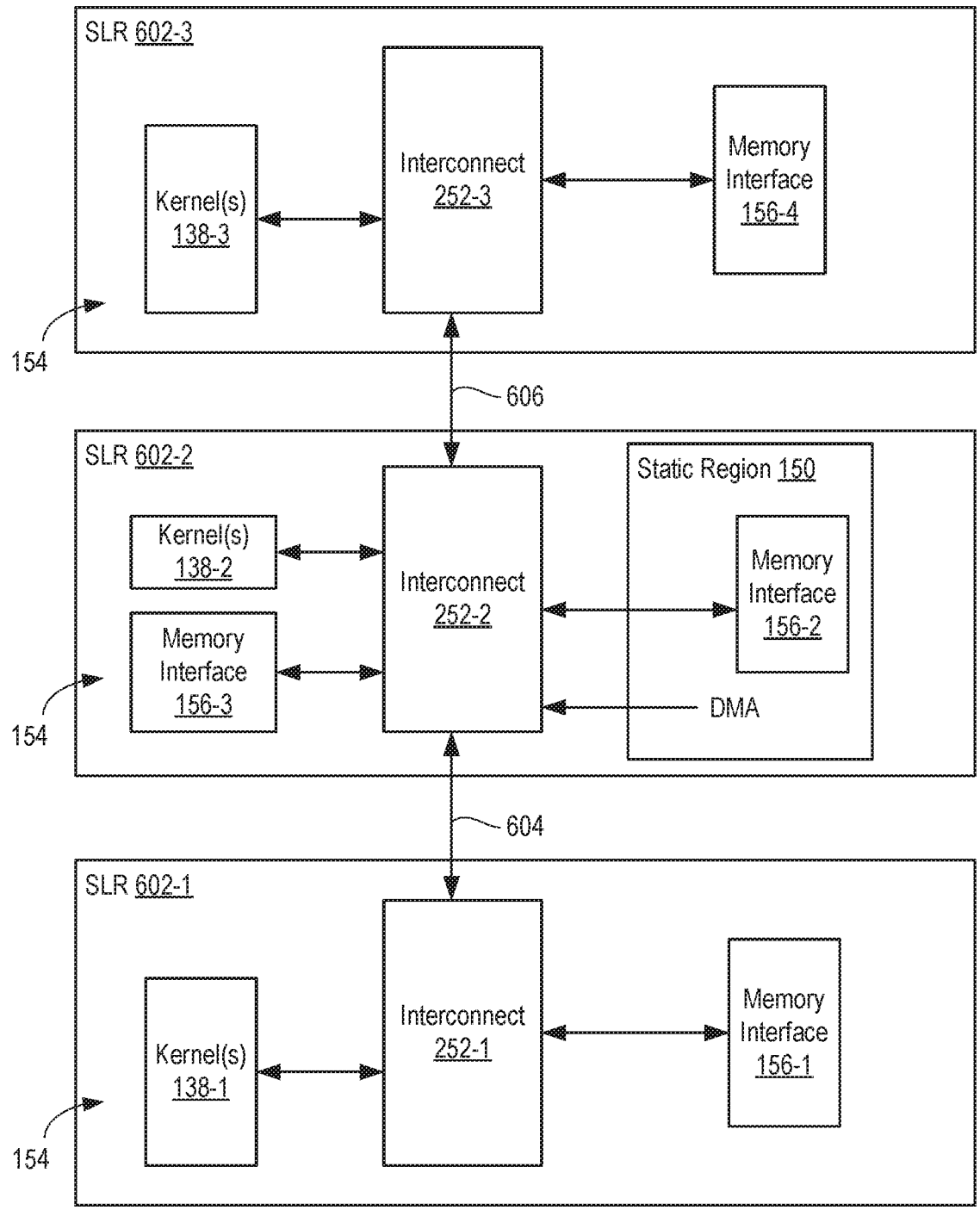
FIGS. 6B and 6C are block diagrams depicting example layouts of an acceleration circuit according to an example.
Figure 6C:
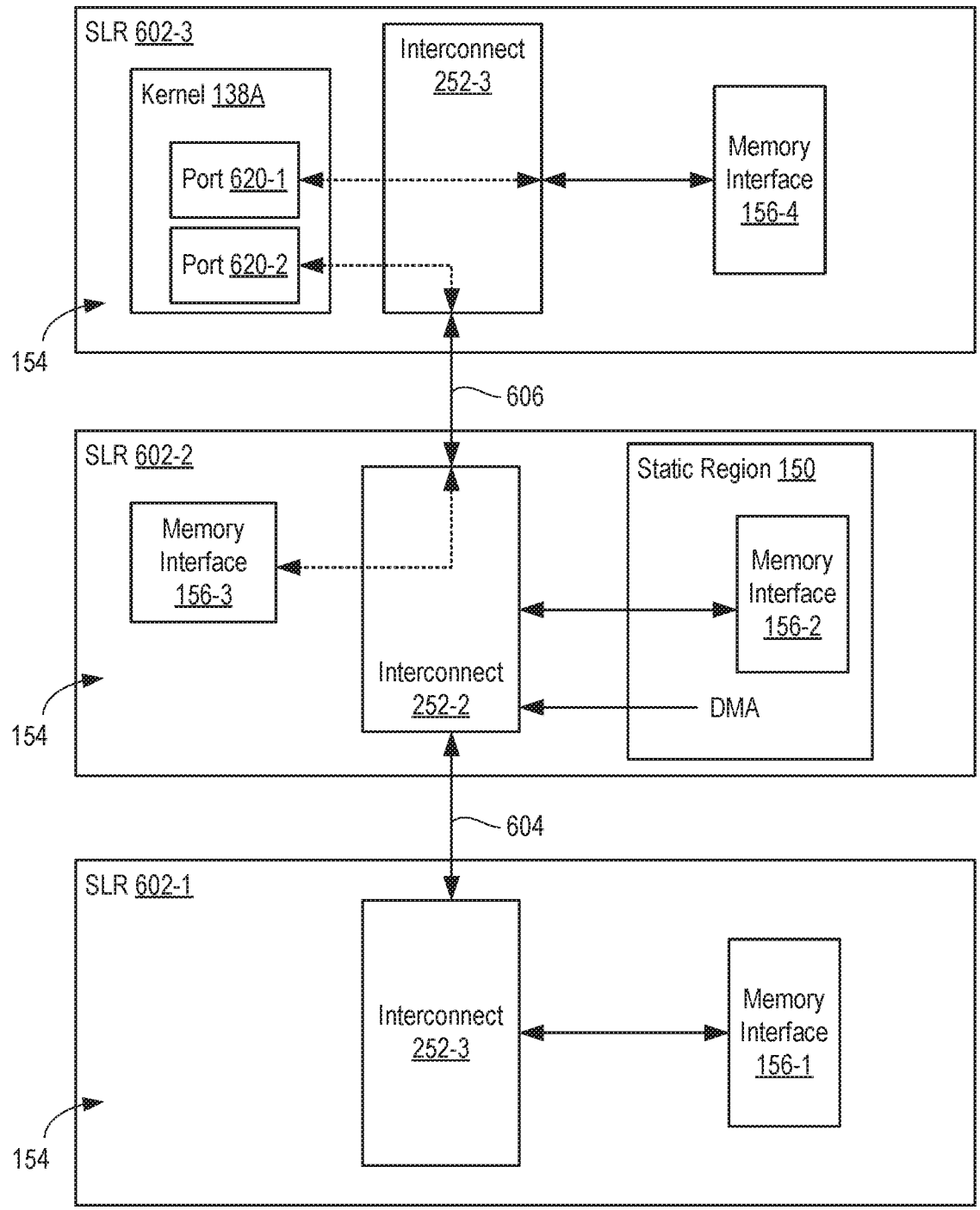

FIG. 6A is a block diagram depicting an example layout 600 of the base platform 140 according to an example. FIGS. 6B and 6C are block diagrams depicting example layouts 601 and 603, respectively, of the acceleration circuit 130 according to an example. The layouts in FIGS. 6A-6C will be used to further understand the optimized linking techniques described herein in FIGS. 7-11.

In the example of FIG. 6A, the programmable device 128 has three SLRs 602-1, 602-2, and 602-3. The static region 152 is disposed in the SLR 602-2 and includes a memory interface 156-2 (where the programmable device 128 includes four memory interfaces 156-1 through 156-4). The dynamic region 154 includes all of the SLR 601-1, all of the SLR 602-3, and a portion of the SLR 602-2 not occupied by the static region 152. In the example, the memory interfaces 156-1, 156-3, and 156-4 are disposed in the dynamic region 154.

In the example of FIG. 6B, the PAR tool 512 has placed kernel(s) 138-1 in the SLR 602-1, kernel(s) 138-2 in the SLR 602-2, and kernel(s) 138-3 in the SLR 602-3. All kernels 138 are placed in the dynamic region 154, as discussed above. The linker 518 has added the memory subsystem 206, which in the example includes parts in each of the SLRs 602-1 through 602-3, i.e., the memory interfaces 156-1, 156-3, and 156-4 and the interconnects 252-1 through 252-3. The interconnects 252-1 through 252-3 are connected by SLLs 604, 606. The interconnect 252 connects memory ports of the kernels 138 to particular memory interfaces 156 as described further herein.

In the example of FIG. 6C, a kernel 138A is placed in the SLR 602-3. Other kernels are omitted for clarity. The kernel 138A includes two memory ports 620-1 and 620-2. In general, a kernel 138 can include one or more memory ports. The interconnect 252-3 connects the memory port 620-1 to the memory interface 156-4. The interconnect 252-3, the SLL 606, and the interconnect 252-2 connects the memory port 620-2 to the memory interface 156-3 in the SLR 602-2.

Figure 7:
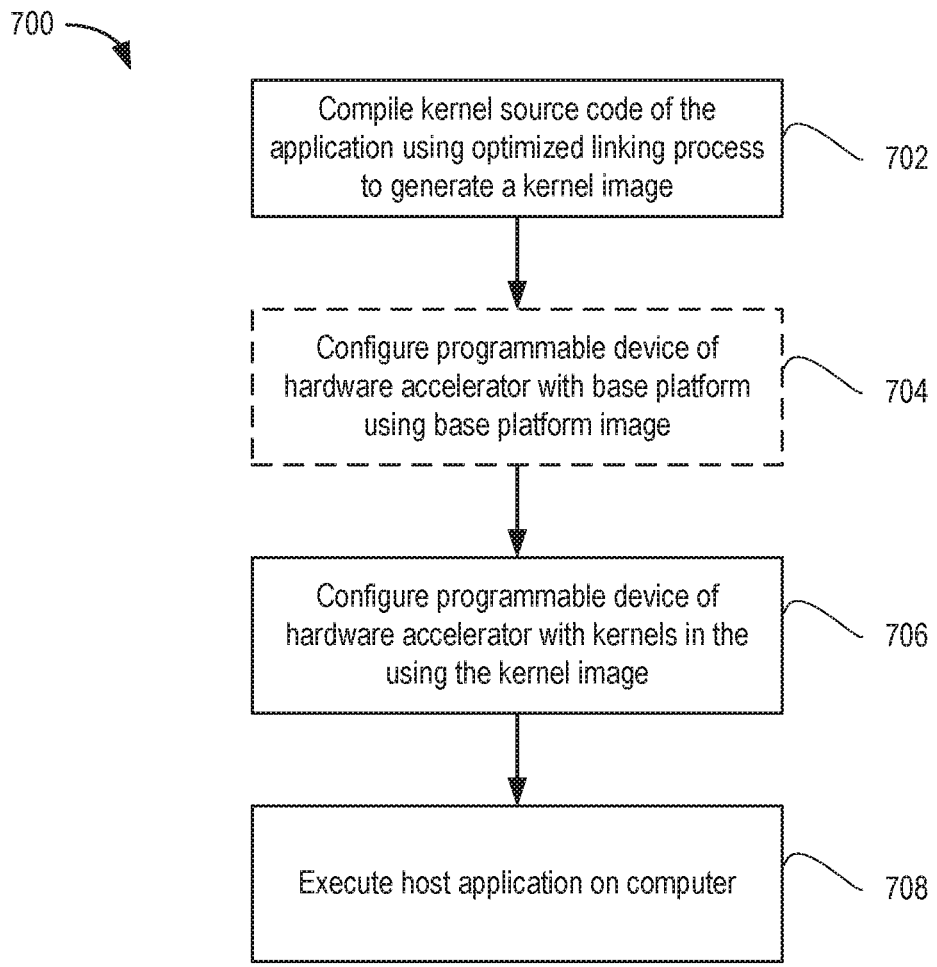
FIG. 7 is a flow diagram depicting a method of creating and executing an accelerated application according to an example.

FIG. 7 is a flow diagram depicting a method 700 of creating and executing an accelerated application according to an example. The method 700 begins a step 702, where the software-defined hardware DE 506 compiles the kernel source code 540 of the application using the optimized linking process described herein to generate the kernel image 120. At step 704, the host application 150 configures the programmable device 128 with the base platform 140 using the base platform image 132. Step 704 is optional and may have been previously performed upon boot up of the host computer. At step 706, the host application 150 configures the programmable device 128 with the kernels 138 using the kernel image 120. At step 708, the host application is executed to use the kernels 138 to process data. It should be understood that programming the programmable device 128 with the base platform 140 at step 704 is a one-time event that occurs at boot-up of the host computer. Execution of the host application 150 can result in the programmable device 128 being partially reprogrammed with different kernel images to implement different sets of kernels while the base platform 140 remains static.

Figure 8:
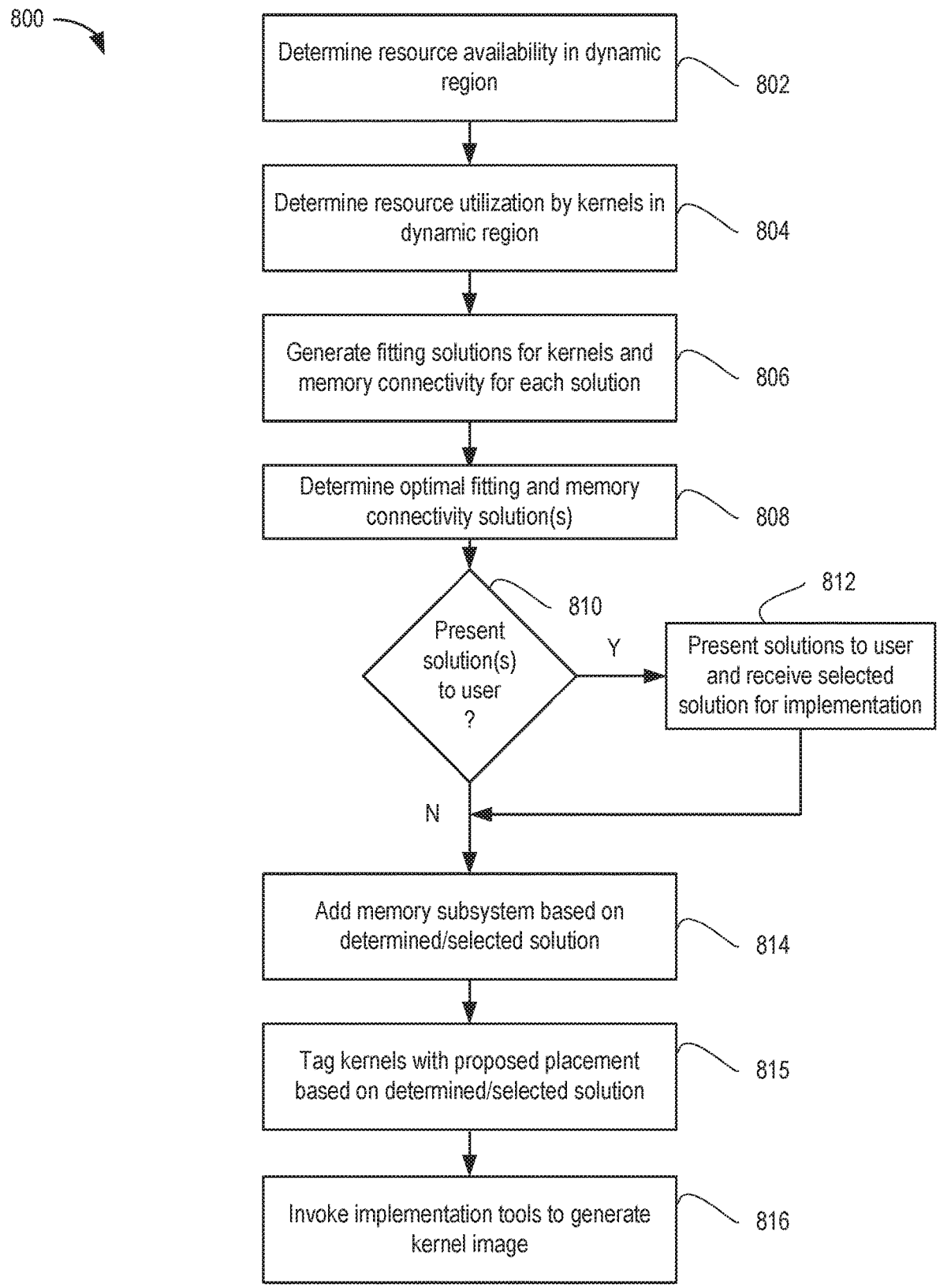
FIG. 8 is a flow diagram depicting a method of linking kernels with a base platform in an acceleration circuit according to an example.

FIG. 8 is a flow diagram depicting a method 800 of linking kernels 138 with the base platform 140 according to an example. The method 800 can be performed by the linker 518 in the software-defined hardware DE 506. The method 800 begins at step 802, where the linker 518 determines resource availability in the dynamic region 154.

Figure 9:
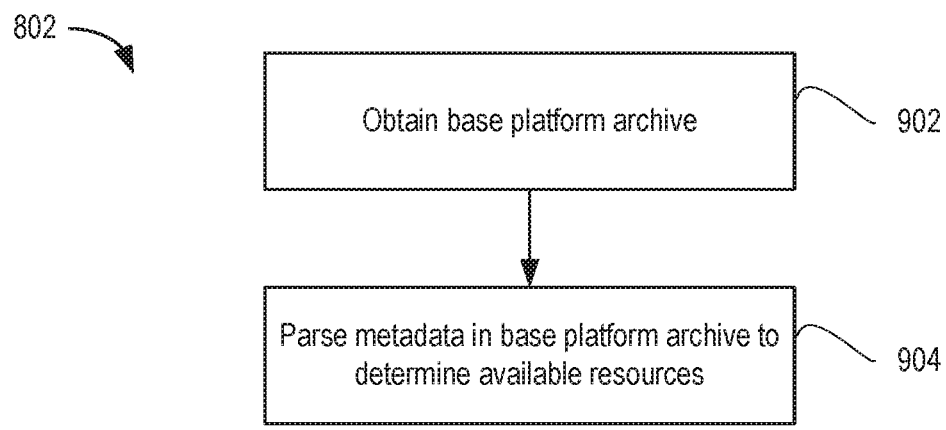
FIG. 9 is a flow diagram depicting a method of determining resource availability in a dynamic region of an acceleration circuit according to an example.

FIG. 9 is a flow diagram depicting a method of determining resource availability in the dynamic region 154 according to an example. The method of FIG. 9 may be performed by the linker 518 at step 802. The method of FIG. 9 begins at step 902, where the linker 518 obtains the base platform archive 132. For example, the user can identify the particular base platform to be used and the linker 518 can access the corresponding base platform archive 132. At step 904, the linker 518 parses the metadata 526 in the base platform archive 132 to determine the available resources in the PL 3 for use by the kernels (e.g., the programmable logic resources of the dynamic region 154). For example, the metadata 526 can specify which SLRs are part of the dynamic region 154. For any SLR occupied by the static region 152, the metadata 526 can identify the amount of programmable logic resources available as part of the dynamic region 154 in that SLR.

Returning to FIG. 8, at step 804, the linker 518 determines resource utilization by the kernels 138 in the dynamic region 154.

Figure 10:
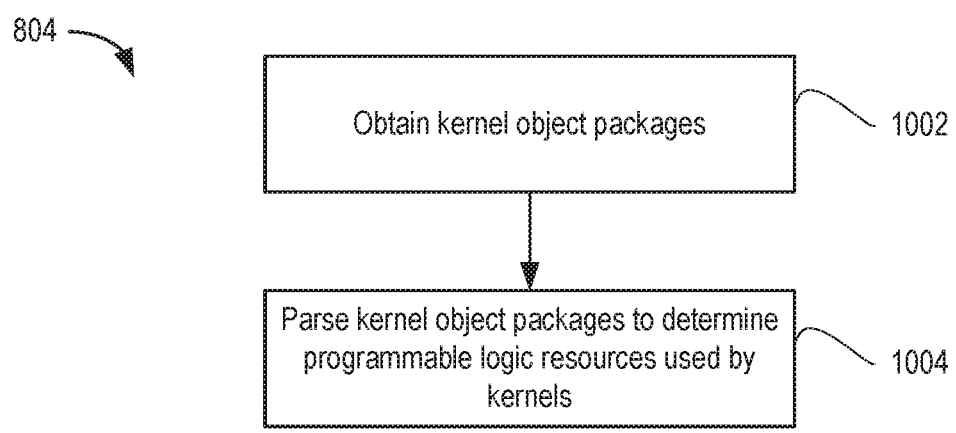
FIG. 10 is a flow diagram depicting a method of determining resource utilization by kernels according to an example.

FIG. 10 is a flow diagram depicting a method of determining resource utilization by the kernels 138 according to an example. The method of FIG. 10 may be performed by the linker 518 at step 804. The method of FIG. 10 begins at step 1002, where the linker 518 obtains the kernel object packages 550 output from the compiler 516. At step 1004, the linker 518 parses the kernel object packages to determine programmable logic resources used by the kernels 138. For example, the linker 518 can parse the metadata 554 in each of the kernel object packages 550 to obtain resource utilization of each kernel 138. In an example, each kernel object package 550 includes netlists 552, which have been synthesized from RTL descriptions of the kernels 138. The netlists 552 include logical circuit descriptions of the kernels 138 in terms of the programmable logic resources. The metadata 554 expresses the amount of programmable logic resources used by each netlist 552.

Returning to FIG. 8, at step 806, the linker 518 determines multiple fitting solutions for the kernels in the dynamic region 154 and corresponding memory connectivity for each fitting solution. In an example, the linker 518 employs a "constraint programming" paradigm to solve for legal and unique kernel fitting solutions. The linker 518 uses the resource utilization requirements of the kernels 138 to be linked into the dynamic region 154, and the resource availability data that contains the available programmable logic resources on per-SLR granularity. The linker 518 then solves for all possible combinations of kernel-to-SLR location mappings which do not over-utilize available programmable logic resources, before finally filtering for unique solutions only. The linker 518 also executes a heuristic-based matching algorithm to assign kernels (which have been assigned SLRs) to the best choice in memory interface assignment per fitting solution, based on both physical reachability and bandwidth availability.

At step 808, the linker 518 determines one or more optimal fitting and memory connectivity solutions for the kernels 138. In an example, the linker 518 can assign a score to each fitting solution ("resource utilization score") and each memory connectivity solution ("memory affinity score"). The linker 518 can then sort the fitting solutions based on resource utilization score, memory affinity score, or some combination of both scores to select one or more optimal solutions. The linker 518 can balance the importance of kernel fitting with memory connectivity to select the optimal solution(s).

At step 810, the linker 518 can determine whether to present the solution(s) to the user. For example, the user may have selected an option to review the optimal solutions. If so, the method 800 proceeds to step 812, where the linker 518 presents the solution(s) to the user and receives a selected solution for implementation. In either case, the method 800 proceeds to step 814. At step 814, the linker 518 adds the memory subsystem 206 to the dynamic region 154 based on a determined or user-selected solution for kernel location and memory connectivity. In this manner, the memory subsystem 206 is configured with knowledge of kernel location ahead of the placement process and can more efficiently generate the interconnect.

At step 815, the linker 518 tags each of the kernels with a proposed placement based on the determined or user-selected solution for kernel location. The PAR tool 512 will use the proposed placement during the place-and-route process. At step 816, the linker 518 invokes implementation tools (e.g., the PAR tool 512 and the bitstream generator 514) to generate the kernel image.

Figure 11:
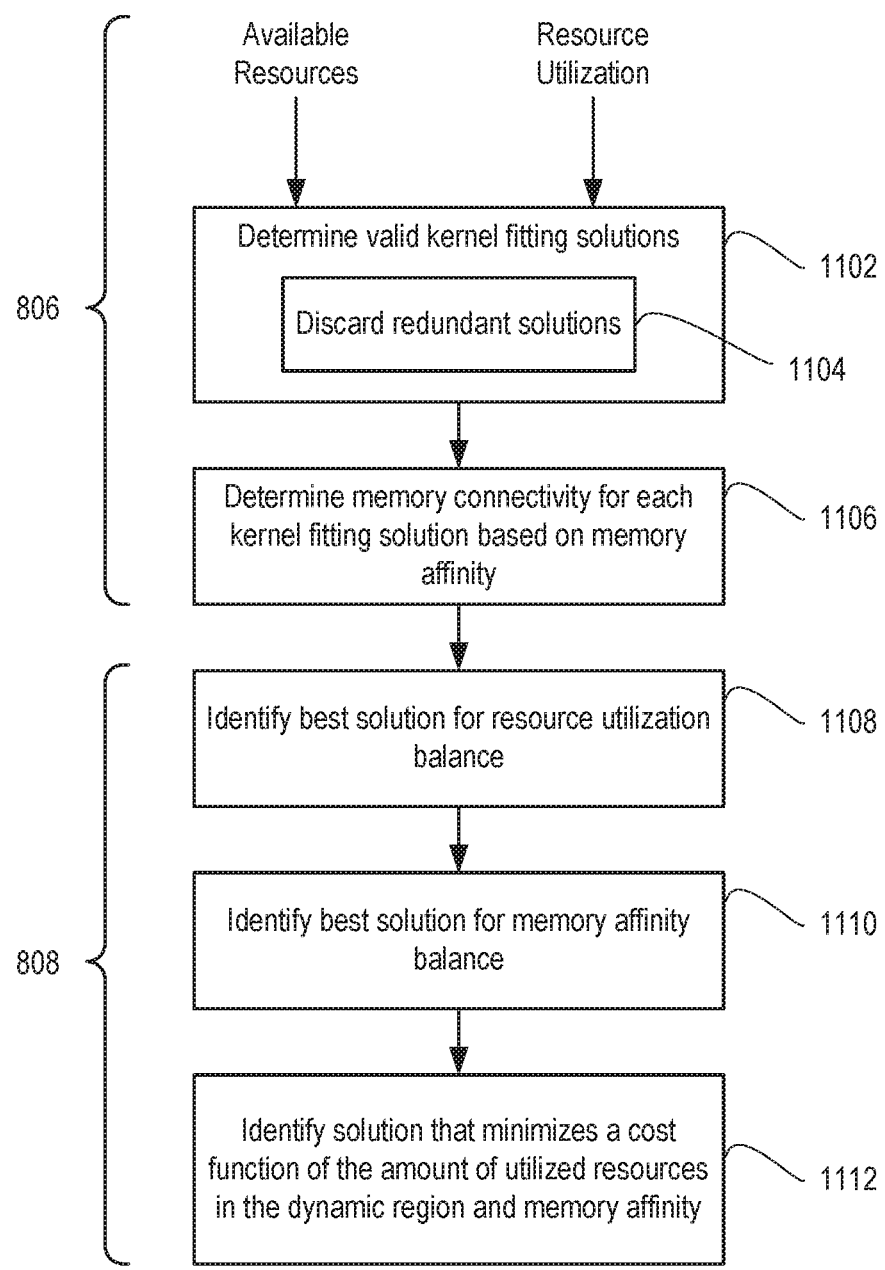
FIG. 11 is a flow diagram depicting a fitting and memory connectivity solution algorithm of a linker in more detail according to an example.

FIG. 11 is a flow diagram depicting the fitting and memory connectivity solution algorithm of the linker 518 in more detail according to an example. At step 1102, the linker 518 uses the dynamic region resource availability and kernel resource utilization data to determine valid kernel fitting solutions. For example, as shown in FIG. 6B, the kernels 138-3 can be located in SLR 602-3, the kernels 138-2 can be located in the SLR 602-2, and the kernels 138-1 can be located in the SLR 602-1. While one fitting solution is shown in FIG. 6B, the linker 518 determines every valid fitting solution. At step 1104, the linker 518 discards any redundant solutions.

At step 1106, the linker 518 determines memory connectivity for each kernel fitting solution based on memory affinity, which can take into account physical reachability and bandwidth availability. For example, as shown in FIG. 6C, the linker 518 can determine that the port 620-1 of the kernel 138A should be connected to the memory interface 156-4, and the port 620-2 of the kernel 138A should be connected to the memory interface 156-3. This decision can be based on physical reachability (e.g., the memory interface 156-4 is disposed in the same SLR 602-3 as the kernel 138A) and bandwidth availability (e.g., the memory interface 156-3 may have less connections than the memory interface 156-4). The steps 1102 and 1106 can be performed during step 806 of the method 800 described above. Although shown in sequence, the steps 1102 and 1106 can be executed concurrently.

At step 1108, the linker 518 identifies a best solution for resource utilization balance. For example, the linker 518 can sort the identified fitting solutions based on resource utilization and select the best one of the fitting solutions. At step 1110, the linker 518 identifies a best solution for memory affinity. For example, the linker 518 can sort the identified fitting solutions based on memory affinity (e.g., physical reachability and bandwidth availability) and select the fitting solution having the best memory affinity. Note that the solutions in steps 1108 and 1110 may be different fitting solutions or the same fitting solution. At step 1112, the linker 518 identifies a fitting solution that minimizes some cost function of resource availability and memory affinity. This may produce a solution different from either or both of steps 1108 and 1110, but may provide a more balanced solution that accounts for both resource availability and memory affinity. Steps 1108-1112 may be performed as part of step 808 in the method 800. All of the solutions generated at steps 1108-1112 may be presented to the user at step 812 for selection. The user can then select the solution based on their desired goal (e.g., resource utilization, memory affinity, or a balance of both).

Techniques for implementing applications for hardware accelerators in computing systems have been described. In particular, techniques described herein identify, at a coarse-grained initial level during the very start of the design flow, and by using resource utilization data from user kernels together with resource availability data from the base platform, good default kernel locations and memory connectivity. The default kernel locations seed the back-end implementation tools with correct-by-construction logical designs and thereby improves runtime and QOR. Different approaches and algorithms are possible, but the fundamental functionality of the approach can be expressed separately from the details of the algorithm implementation. The general technique is important for high-level, data-driven placement and memory affinity decision making based on available metadata. The techniques provide a data-driven approach to adjusting the logical design (memory subsystem infrastructure configurations, kernel-to-platform infrastructure connectivity, kernel-to-memory connection options) automatically, in particular to account for physical aspects of the device.

The various examples described herein may employ various computer-implemented operations involving data stored in computer systems. For example, these operations may require physical manipulation of physical quantities-usually, though not necessarily, these quantities may take the form of electrical or magnetic signals, where they or representations of them are capable of being stored, transferred, combined, compared, or otherwise manipulated. Further, such manipulations are often referred to in terms, such as producing, identifying, determining, or comparing. Any operations described herein that form part of one or more embodiments of the invention may be useful machine operations. In addition, one or more examples also relate to a device or an apparatus for performing these operations. The apparatus may be specially constructed for specific required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The various examples described herein may be practiced with other computer system configurations including handheld devices, microprocessor systems, microprocessor-based or programmable consumer electronics, minicomputers, mainframe computers, and the like.

One or more examples described herein may be implemented as one or more computer programs or as one or more computer program modules embodied in one or more computer readable media. The term computer readable medium refers to any data storage device that can store data which can thereafter be input to a computer system-computer readable media may be based on any existing or subsequently developed technology for embodying computer programs in a manner that enables them to be read by a computer. Examples of a computer readable medium include a hard drive, network attached storage (NAS), read-only memory, random-access memory (e.g., a flash memory device), a CD (Compact Discs)—CD-ROM, a CD-R, or a CD-RW, a DVD (Digital Versatile Disc), a magnetic tape, and other optical and non-optical data storage devices. The computer readable medium can also be distributed over a network coupled computer system so that the computer readable code is stored and executed in a distributed fashion.

While the foregoing is directed to specific examples, other and further examples may be devised without departing from the basic scope thereof, and the scope thereof is determined by the claims that follow.

What is claimed is:

1. A method of implementing an application for a hardware accelerator having a programmable device coupled to a memory, the method comprising:
determining fitting solutions of kernel circuits within programmable logic of the programmable device, each of the fitting solutions defining connectivity of the kernel circuits to memory resources of the memory;
adding a memory subsystem to the application based on a selected fitting solution of the fitting solutions; and
generating a kernel image configured to program the programmable logic to implement the kernel circuits and the memory subsystem.

2. The method of claim 1 further comprising determining resource availability, wherein the fitting solutions of the kernel circuits are determined based on the resource availability.

3. The method of claim 2, wherein determining the resource availability comprises:
obtaining a base platform archive having an image of a base platform and metadata describing the base platform; and
parsing the metadata to determine resources in the programmable logic not in use by the base platform.

4. The method of claim 2 further comprising determining resource utilization by the kernel circuits, wherein the fitting solutions of the kernel circuits are determined based on the resource utilization.

5. The method of claim 4, wherein determining the resource utilization comprises determining resources in the programmable logic associated with the kernel circuits from metadata derived from the kernel circuits.

6. The method of claim 4, wherein the step of determining the fitting solutions comprises:
determining valid fitting solutions based on one or more of the resource availability and the resource utilization;
determining connectivity to the memory resources among the kernel circuits for each of the valid fitting solutions; and
identifying a valid fitting solution of the valid fitting solutions that minimizes a function of an amount of utilized resources in the programmable logic and affinity to the memory resources.

7. The method of claim 4, wherein determining the fitting solutions comprises:
determining valid fitting solutions based on one or more of the resource availability and the resource utilization;
determining connectivity to the memory resources among the kernel circuits for each of the valid fitting solutions; and
identifying a valid fitting solution of the valid fitting solutions based on an amount of resources used by each of the valid fitting solutions.

8. The method of claim 4, wherein the step of determining the fitting solutions comprises:
- determining valid fitting solutions based on the resource availability and the resource utilization;
- determining connectivity to the memory resources among the kernel circuits for each of the valid fitting solutions; and
- identifying a valid fitting solution of the valid fitting solutions that maximizes affinity to the memory resources.

9. The method of claim 1, wherein the programmable device comprises a plurality of super logic regions (SLRs), each disposed within a respective one of a plurality of programmable integrated circuits (ICs) mounted to an interposer, and wherein a static region is disposed in a first portion of the SLRs and a dynamic region includes a portion of the SLRs other than the first portion.

10. A non-transitory computer readable medium having instructions stored thereon that cause a processor to perform a method of implementing an application for a hardware accelerator having a programmable device coupled to a memory, the method comprising:
- determining fitting solutions of kernel circuits within programmable logic of the programmable device, each of the fitting solutions defining connectivity of the kernel circuits to memory resources of the memory;
- adding a memory subsystem to the application based on a selected fitting solution of the fitting solutions; and
- generating a kernel image configured to program the programmable logic to implement the kernel circuits and the memory subsystem.

11. The non-transitory computer readable medium of claim 10, wherein the method further comprises:
- determining resource availability, wherein the fitting solutions of the kernel circuits are determined based on the resource availability; and
- determining resource utilization by the kernel circuits, wherein the fitting solutions of the kernel circuits are determined based on the resource utilization.

12. The non-transitory computer readable medium of claim 11, wherein the step of determining the fitting solutions comprises:
- determining valid fitting solutions based on one or more of the resource availability and the resource utilization;
- determining connectivity to the memory resources among the kernel circuits for each of the valid fitting solutions; and
- identifying a valid fitting solution of the valid fitting solutions that minimizes a function of an amount of utilized resources in the programmable logic and affinity to the memory resources.

13. The non-transitory computer readable medium of claim 11, wherein the step of determining the fitting solutions comprises:
- determining valid fitting solutions based on one or more of the resource availability and the resource utilization;
- determining connectivity to the memory resources among the kernel circuits for each of the valid fitting solutions; and
- identifying a valid fitting solution of the valid fitting solutions based on an amount of resources used by each of the valid fitting solutions.

14. The non-transitory computer readable medium of claim 11, wherein the step of determining the fitting solutions comprises:
- determining valid fitting solutions based on the resource availability and the resource utilization;
- determining connectivity to the memory resources among the kernel circuits for each of the valid fitting solutions; and
- identifying a valid fitting solution of the valid fitting solutions that maximizes affinity to the memory resources.

15. A computing system comprising:
- a memory configured to store development software; and
- a processor, coupled to the memory, configured to execute the development software to implement an application for a hardware accelerator having a programmable device coupled to the memory by:
  - determining fitting solutions of kernel circuits within programmable logic of the programmable device, each of the fitting solutions defining connectivity of the kernel circuits to memory resources of the memory;
  - adding a memory subsystem to the application based on a selected fitting solution of the fitting solutions; and
  - generating a kernel image configured to program the programmable logic to implement the kernel circuits and the memory subsystem.

16. The computing system of claim 15, wherein executing the development software further comprises
- determining resource availability, wherein the fitting solutions of the kernel circuits are determined based on the resource availability; and
- determining resource utilization by the kernel circuits, wherein the fitting solutions of the kernel circuits are determined based on the resource utilization.

17. The computing system of claim 16, wherein the determining the fitting solutions comprises:
- determining valid fitting solutions based on one or more of the resource availability and the resource utilization;
- determining connectivity to the memory resources among the kernel circuits for each of the valid fitting solutions; and
- identifying a valid fitting solution of the valid fitting solutions that minimizes a function of an amount of utilized resources in the programmable logic and affinity to the memory resources.

18. The computing system of claim 16, wherein the determining the fitting solutions comprises:
- determining valid fitting solutions based on one or more of the resource availability and the resource utilization;
- determining connectivity to the memory resources among the kernel circuits for each of the valid fitting solutions; and
- identifying a valid fitting solution of the valid fitting solutions based on an amount of resources used by each of the valid fitting solutions.

19. The computing system of claim 16, wherein the determining the fitting solutions comprises:
- determining valid fitting solutions based on the resource availability and the resource utilization;
- determining connectivity to the memory resources among the kernel circuits for each of the valid fitting solutions; and
- identifying a valid fitting solution of the valid fitting solutions that maximizes affinity to the memory resources.

20. The computing system of claim 16, wherein determining the resource availability comprises:
- obtaining a base platform archive having an image of a base platform and metadata describing the base platform; and determining resources in the programmable logic not in use by the base platform based on the metadata, and wherein determining the resource utilization comprises determining resources in the programmable logic associated with the kernel circuits from metadata derived from the kernel circuits.

* * * * *